United States Patent
Chun et al.

(10) Patent No.: US 7,576,589 B2
(45) Date of Patent: Aug. 18, 2009

(54) BOOST VOLTAGE GENERATING CIRCUIT INCLUDING ADDITIONAL PUMP CIRCUIT AND BOOST VOLTAGE GENERATING METHOD THEREOF

(75) Inventors: Ki-Chul Chun, Gyeonggi-do (KR); Chang-Ho Shin, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 166 days.

(21) Appl. No.: 11/360,106

(22) Filed: Feb. 22, 2006

(65) Prior Publication Data
US 2006/0192607 A1  Aug. 31, 2006

(30) Foreign Application Priority Data
Feb. 26, 2005  (KR)  ............... 10-2005-0016260

(51) Int. Cl.
*G05F 1/10* (2006.01)
*G05F 3/02* (2006.01)
(52) U.S. Cl. .................. 327/536; 327/148; 327/157; 327/537
(58) Field of Classification Search .......... 327/536, 327/148, 157, 537
See application file for complete search history.

(56) References Cited

U.S. PATENT DOCUMENTS

| | | | | |
|---|---|---|---|---|
| 6,292,048 B1 * | 9/2001 | Li | ............... | 327/536 |
| 6,373,322 B2 * | 4/2002 | Kobayashi et al. | .......... | 327/536 |
| 6,683,488 B2 * | 1/2004 | Jin | ............... | 327/536 |
| 6,781,439 B2 * | 8/2004 | Tanzawa et al. | ............. | 327/536 |
| 2003/0058029 A1 * | 3/2003 | Matsui | .............. | 327/536 |
| 2003/0076156 A1 * | 4/2003 | Shim | .............. | 327/536 |
| 2003/0227321 A1 * | 12/2003 | Kim et al. | ............ | 327/536 |
| 2005/0088220 A1 * | 4/2005 | Hahn et al. | ............ | 327/536 |
| 2006/0097771 A1 * | 5/2006 | Cho et al. | ............ | 327/536 |

FOREIGN PATENT DOCUMENTS

| | | |
|---|---|---|
| JP | 20003-249076 | 9/2003 |
| KR | 1997-0051096 | 7/1997 |
| KR | 1998-075793 | 11/1998 |
| KR | 2000-0030505 | 6/2000 |

OTHER PUBLICATIONS

English language abstract of Korean Publication No. 1998-075793.
English language abstract of Korean Publication No. 2000-0030505.
English language abstract of Japanese Publication No. 20003-249076.

* cited by examiner

*Primary Examiner*—Kenneth B Wells
*Assistant Examiner*—John W Poos
(74) *Attorney, Agent, or Firm*—Marger Johnson & McCollom, P.C.

(57) ABSTRACT

A boost voltage generating circuit of a semiconductor device includes a main pump circuit having a transfer transistor, the main pump circuit to boost a voltage of a boost node and to transfer charge from the boost node to an output node through the transfer transistor in response to at least one control signal, and an additional pump circuit configured to boost a voltage of a terminal of the transfer transistor.

21 Claims, 9 Drawing Sheets

BOOST VOLTAGE GENERATING CIRCUIT INCLUDING ADDITIONAL PUMP CIRCUIT AND BOOST VOLTAGE GENERATING METHOD THEREOF

CROSS-REFERENCE TO RELATED PATENT APPLICATION

This application claims the benefit of Korean Patent Application No. 10-2005-0016260, filed on Feb. 26, 2005, in the Korean Intellectual Property Office, the disclosure of which is incorporated herein in its entirety by reference.

BACKGROUND OF THE INVENTION

1. Field of the Invention

This disclosure relates to a semiconductor device, and more particularly, to a boost voltage generating circuit and method of a semiconductor device.

2. Description of the Related Art

Semiconductor devices, particularly semiconductor memory devices, often use a boost voltage generating circuit for receiving a power supply voltage from an external source and generating a boost voltage VPP higher than the power supply voltage. Generally, the boost voltage generating circuit is referred to as a VPP pump.

Figure 1:
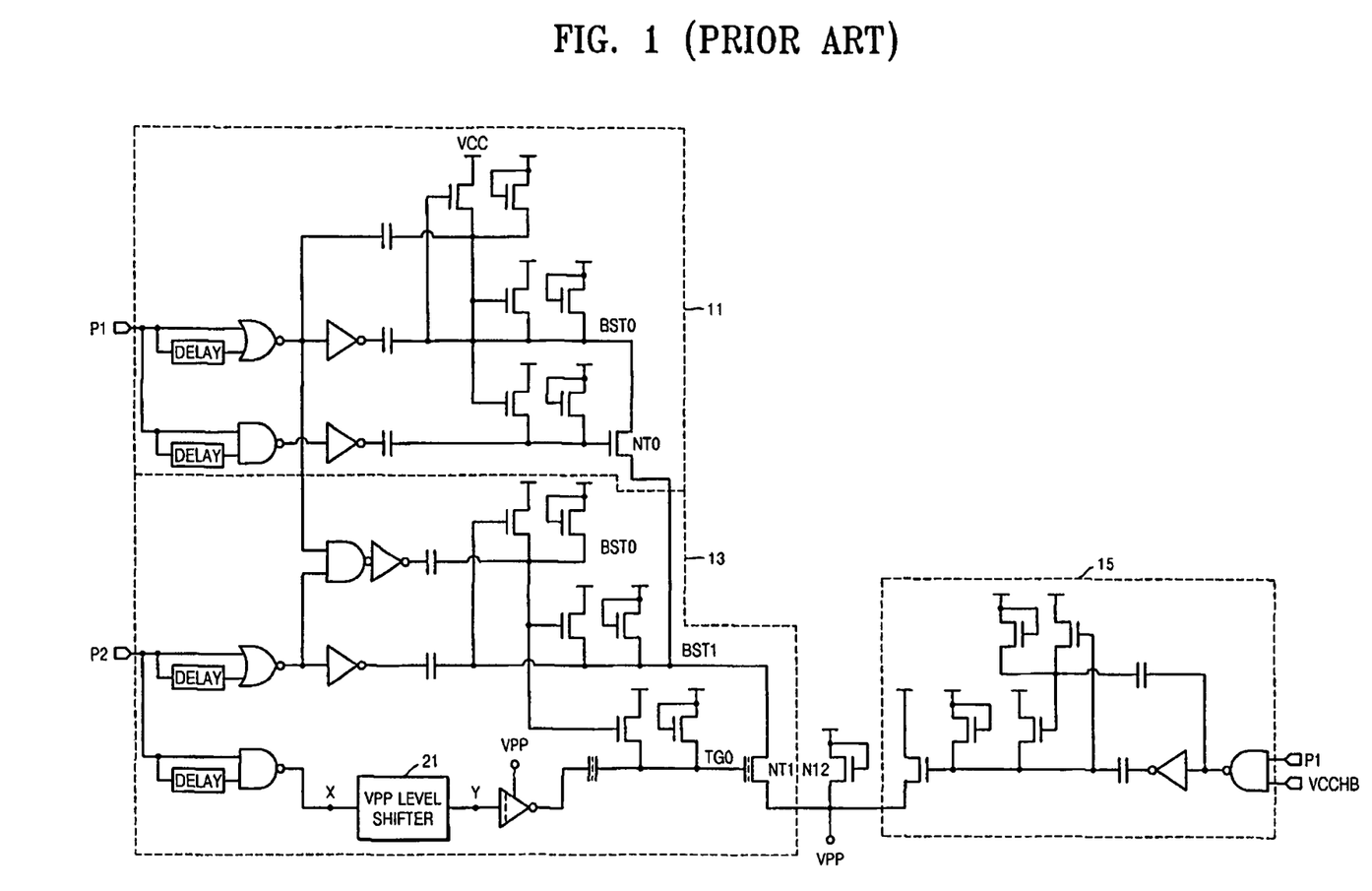
FIG. 1 is a circuit diagram illustrating a conventional boost voltage generating circuit.
Figure 2:
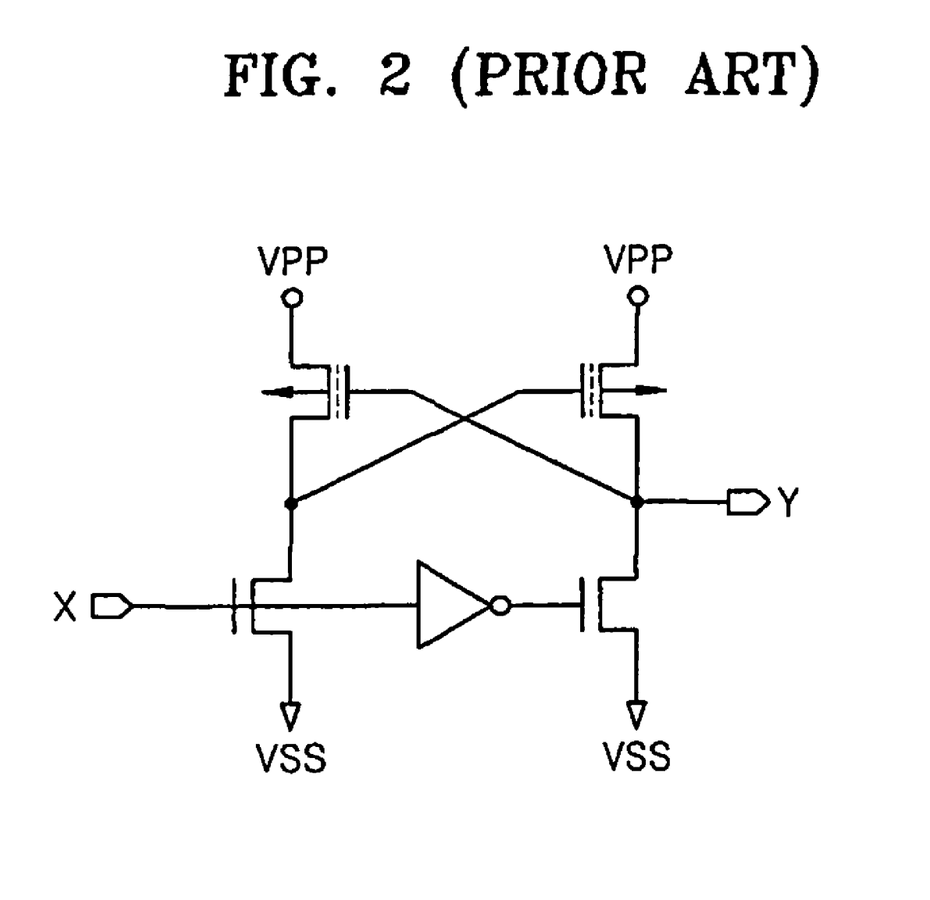
FIG. 2 is a circuit diagram illustrating a VPP level shifter shown in FIG. 1.
Figure 3:
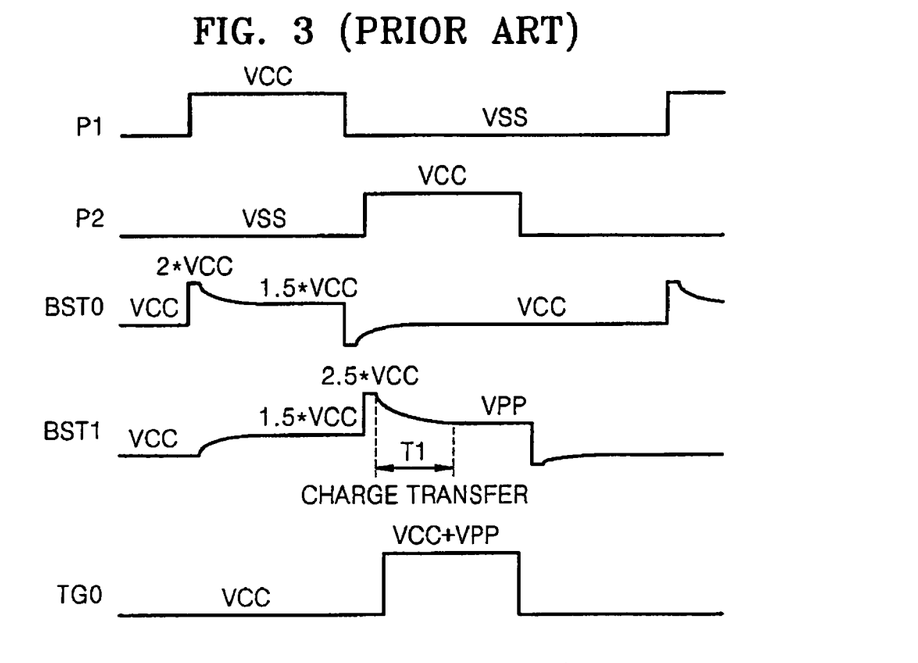
FIG. 3 is a timing diagram illustrating the normal operation of the conventional boost voltage generating circuit shown in FIG. 1.
Figure 4:
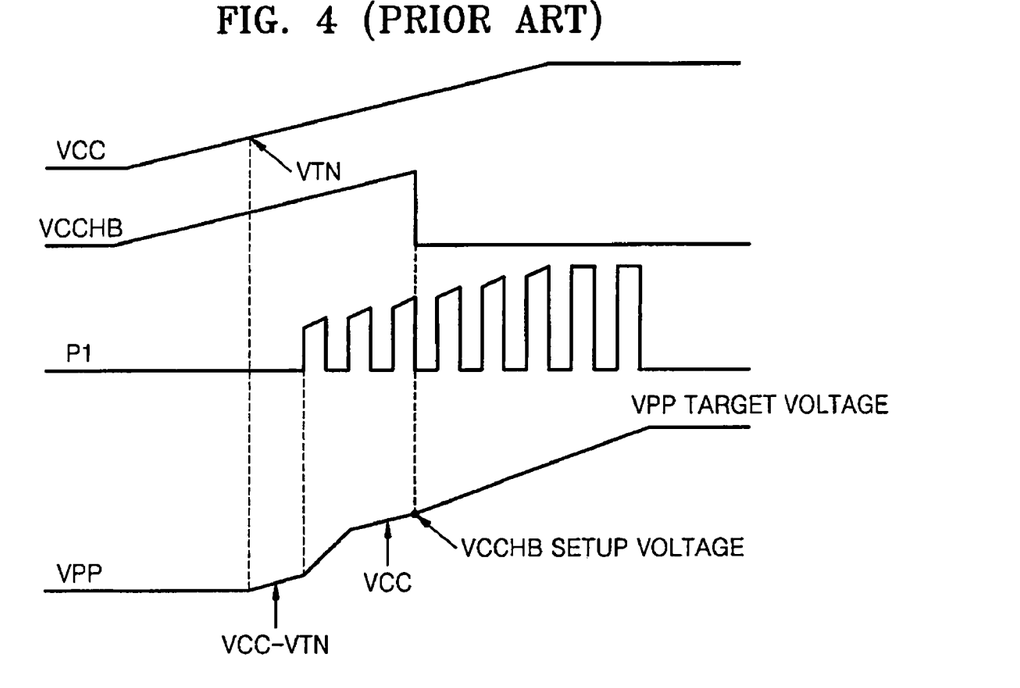
FIG. 4 is a timing diagram illustrating the power-up operation of the conventional boost voltage generating circuit shown in FIG. 1.

FIG. 1 is a circuit diagram illustrating a conventional boost voltage generating circuit, and FIG. 2 is a circuit diagram illustrating a VPP level shifter shown in FIG. 1. FIG. 3 is a timing diagram illustrating the normal operation of the conventional boost voltage generating circuit shown in FIG. 1. And FIG. 4 is a timing diagram illustrating the power-up operation of the conventional boost voltage generating circuit shown in FIG. 1.

Referring to FIG. 1, the conventional boost voltage generating circuit includes unit pump circuits 11 and 13, an output control transistor N12, and an output controlling circuit 15. The conventional boost voltage generating circuit may include two or more unit pump circuits.

The unit pump circuit 11 boosts the voltage of a boost node BST0 in response to a control signal P1, and transfers charge from the boost node BST0 to a boost node BST1 of the unit pump circuit 13 through a transfer transistor NT0. The unit pump circuit 13 boosts the voltage of the boost node BST1 in response to a control signal P2, and transfers charge from the boost node BST1 to an output node VPP through a transfer transistor NT1.

The control signals P1 and P2 are non-overlapping pulse signals generated by a boost voltage detector (not shown) that detects the voltage of the output node VPP, and a signal VCCHB is a reset pulse signal generated during the power-up operation.

The conventional boost voltage generating circuit operates as follows. Referring to FIG. 4, if a power supply voltage VCC increases above the threshold voltage of an NMOS transistor during the power-up operation, the NMOS output control transistor N12 is turned on and thus the voltage of the output node VPP becomes VCC-VTN, obtained by subtracting the threshold voltage VTN of the NMOS transistor from the power supply voltage VCC. If the control signal P1 is toggled, the voltage of the output node VPP is held in the power supply voltage VCC until the signal VCCHB is setup. If the power supply voltage VCC increases during the power-up operation, the voltage of the output node VPP also increases.

If the voltage of the output node VPP increases above the voltage for operating the VPP level shifter 21 shown in FIG. 1, charge from the boost node BST1 is transferred to the output node VPP through the transfer transistor NT1, and the voltage of the output node VPP increases above the power supply voltage VCC. If the voltage of the output node VPP reaches a target value, the control signals P1 and P2 become low and thus the pumping operations of the pump circuits 11 and 13 are stopped. If the charge of the output node VPP is consumed by the operation of the semiconductor memory device, the pumping operations are performed again. The transistor and the inverter shown by dotted lines in FIG. 1 are the portions to which the VPP level is applied, and use thick oxide in order to ensure reliability.

Figure 5:
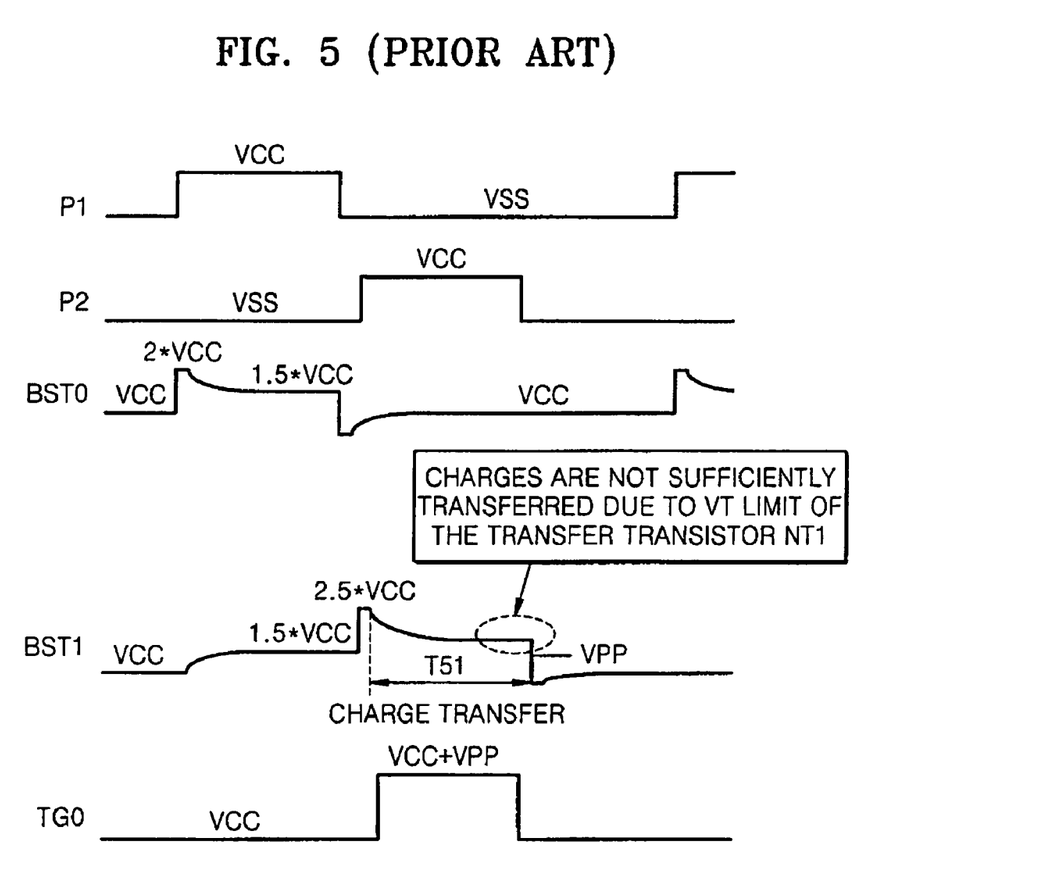
FIG. 5 is a timing diagram illustrating the normal operation of the conventional boost voltage generating circuit shown in FIG. 1 at a low power supply voltage VCC.
Figure 6:
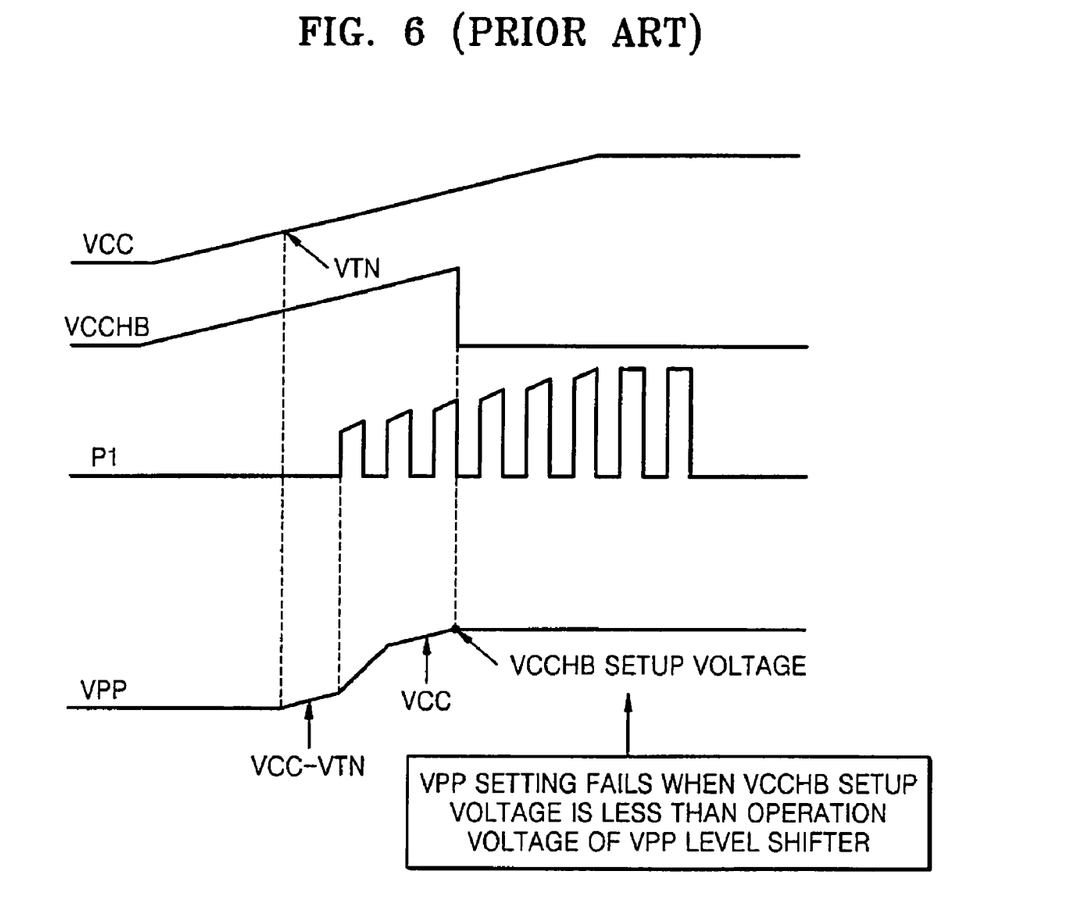
FIG. 6 is a timing diagram illustrating the power-up operation of the conventional boost voltage generating circuit shown in FIG. 1 at a low power supply voltage VCC.

FIG. 5 is a timing diagram illustrating the normal operation of the conventional boost voltage generating circuit shown in FIG. 1 at a low power supply voltage VCC. FIG. 6 is a timing diagram illustrating the power-up operation of the conventional boost voltage generating circuit at a low power supply voltage VCC as shown in FIG. 1.

If the power supply voltage VCC of the semiconductor memory device is decreased, the setup voltage of a power-up reset pulse signal VCCHB is also decreased. A transistor using thick oxide has a higher threshold voltage than a transistor using thin oxide. As shown in FIG. 6, if the setup voltage of the power-up reset pulse signal VCCHB is decreased below the threshold voltage of the PMOS transistor of the VPP level shifter 21, the boosting operation and the charge transfer operation are not performed well. Thus, the VPP level does not increase above the setup voltage of the power-up reset pulse signal VCCHB.

Also, although the setup voltage of the power-up reset pulse signal VCCHB increases above the threshold voltage of the PMOS transistor of the VPP level shifter 21 (FIG. 2), it takes much time to transfer the charge of the boost node BST1 to the output node VPP, due to the weak driving power of the transfer transistor NT1. The result is that an active cycle time of the semiconductor memory device is long. In some cases, insufficient charge is transferred from the boost node BST1 to the output node VPP, and thus the performance of the boost voltage generating circuit may severely deteriorate.

SUMMARY OF THE INVENTION

An embodiment includes a boost voltage generating circuit of a semiconductor device including a main pump circuit having a transfer transistor, the main pump circuit to boost a voltage of a boost node and to transfer charge from the boost node to an output node through the transfer transistor in response to at least one control signal, and an additional pump circuit configured to boost a voltage of a terminal of the transfer transistor.

Another embodiment includes a method of generating a boost voltage for a semiconductor device including boosting the voltage of a boost node in response to at least one control signal, transferring charge from the boost node to an output node through a transfer transistor, and additionally boosting the voltage of a terminal of the transfer transistor.

BRIEF DESCRIPTION OF THE DRAWINGS

The above and other features and advantages of the invention will become more apparent by describing embodiments in detail with reference to the attached drawings in which.

DETAILED DESCRIPTION OF THE INVENTION

The attached drawings illustrate embodiments of the invention, and are referred to in order to provide a sufficient understanding of the invention, the merits thereof, and the objectives accomplished by the implementation of the embodiments.

Hereinafter, embodiments will be described in detail with reference to the attached drawings. Like reference numerals denote like elements in the drawings.

Figure 7:
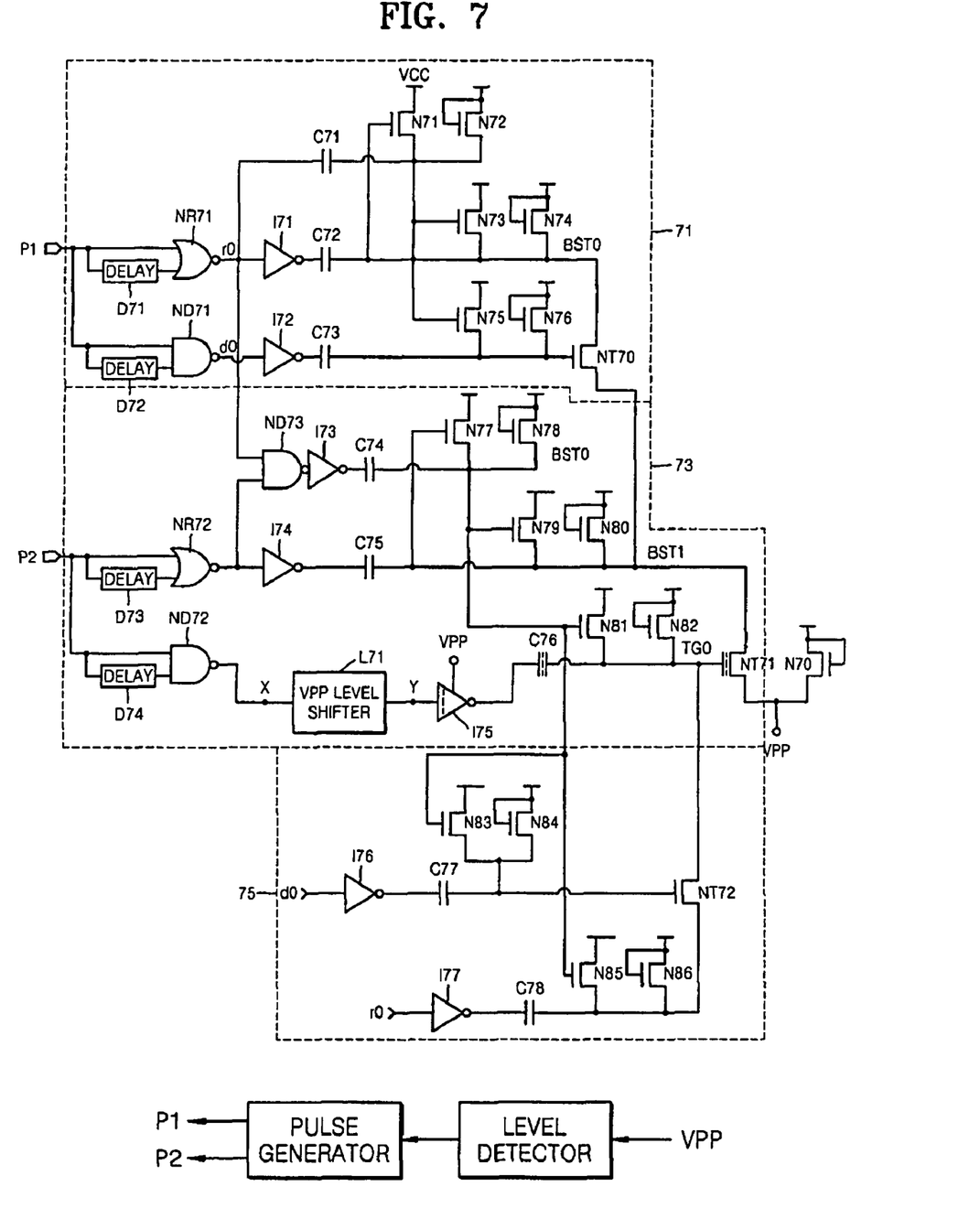
FIG. 7 is a circuit diagram illustrating a boost voltage generating circuit according to an embodiment.

FIG. 7 is a circuit diagram illustrating a boost voltage generating circuit according to an embodiment.

The boost voltage generating circuit includes unit pump circuits 71 and 73, an output control transistor N70 and an additional pump circuit 75.

The unit pump circuit 71 boosts the voltage of a boost node BST0 in response to a control signal P1, and transfers charge from the boost node BST0 to a boost node BST1 of the unit pump circuit 73 through a transfer transistor NT70. The unit pump circuit 73 boosts the voltage of the boost node BST1 in response to a control signal P2, and transfers charge from the boost node BST1 to an output node VPP through a transfer transistor NT71. The control signals P1 and P2 may be non-overlapping pulse signals generated by a boost voltage detector (not shown) for detecting the voltage of the output node VPP. The unit pump circuit 71 includes delay units D71 and D72, a NOR gate NR71, a NAND gate ND71, inverters I71 and I72, capacitors C71 through C73, NMOS transistors N71 through N76 and an NMOS transfer transistor NT70. The unit pump circuit 73 includes delay units D73 and D74, a NOR gate NR72, NAND gates ND72 and ND73, inverters I73 through I75, capacitors C74 through C76, a VPP level shifter L71, NMOS transistors N77 through N82 and an NMOS transfer transistor NT71.

The output control transistor N70 is an NMOS transistor. The output control transistor N70 is turned on if a power supply voltage VCC increases above the threshold voltage of the NMOS transistor during the power-up operation, and thus the voltage of the output node VPP is pulled to VCC-VTN, the power supply voltage VCC reduced by the threshold voltage VTN of the NMOS transistor.

The additional pump circuit 75 is coupled to the gate of the transfer transistor NT71 in the unit pump circuit 73, and additionally boosts the voltage of the gate TG0 of the transfer transistor NT71 in response to the signals r0 and d0 generated by the control signal P1. The additional pump circuit 75 includes inverters I76 and I77, capacitors C77 and C78, NMOS transistors N83 through N86, and an NMOS transfer transistor NT72.

Since the detailed structures of the pump circuits 71, 73, and 75 are well known to those of ordinary skill in the art, the descriptions will be omitted. It is apparent that the unit pump circuits 71 and 73 may be of various types. Also, although the boost voltage generating circuit according to this embodiment includes the two unit pump circuits in FIG. 7, other embodiments may include three or more unit pump circuits. The transistor NT71, and the inverter I75 and capacitor C76 shown by dotted lines in FIG. 7 are the portions to which the VPP level is applied, and use thick oxide in order to ensure reliability.

Figure 8:
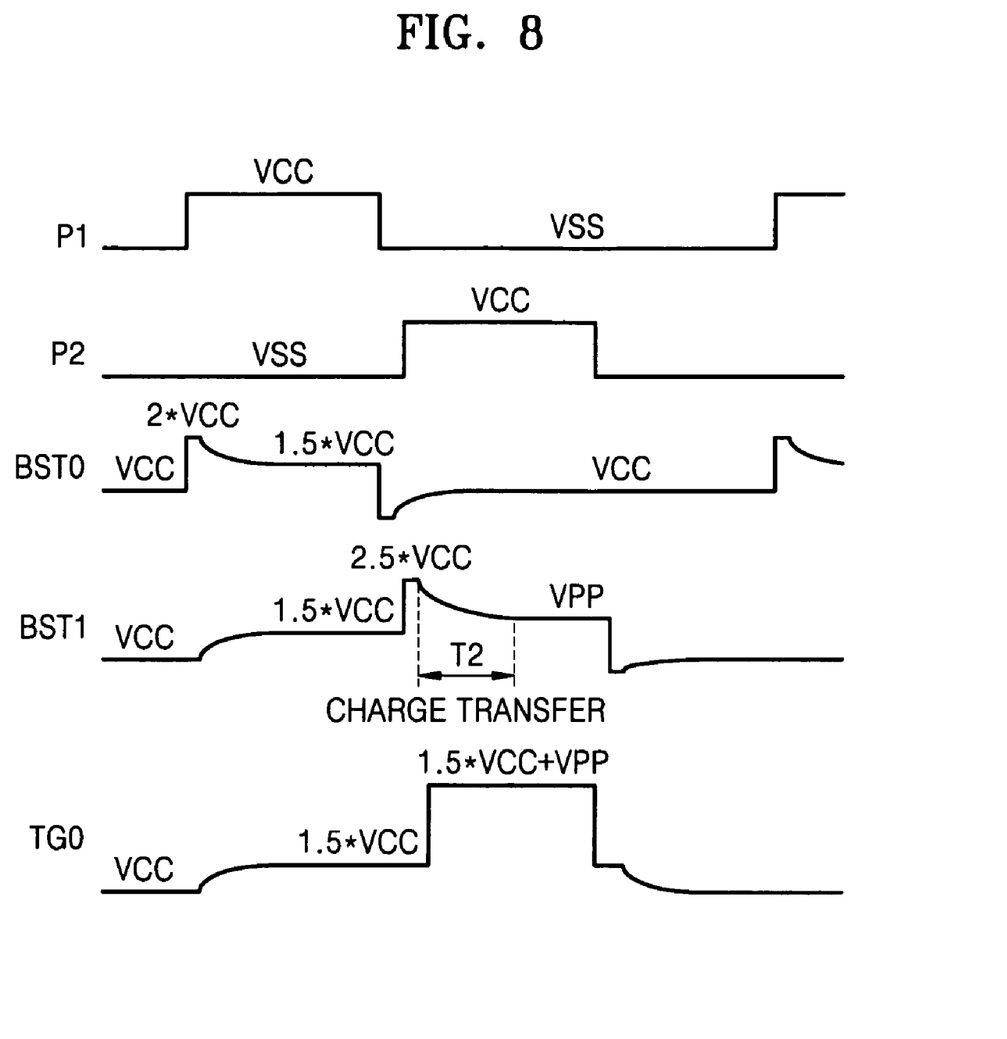
FIG. 8 is a timing diagram illustrating the normal operation of the boost voltage generating circuit shown in FIG. 7.
Figure 9:
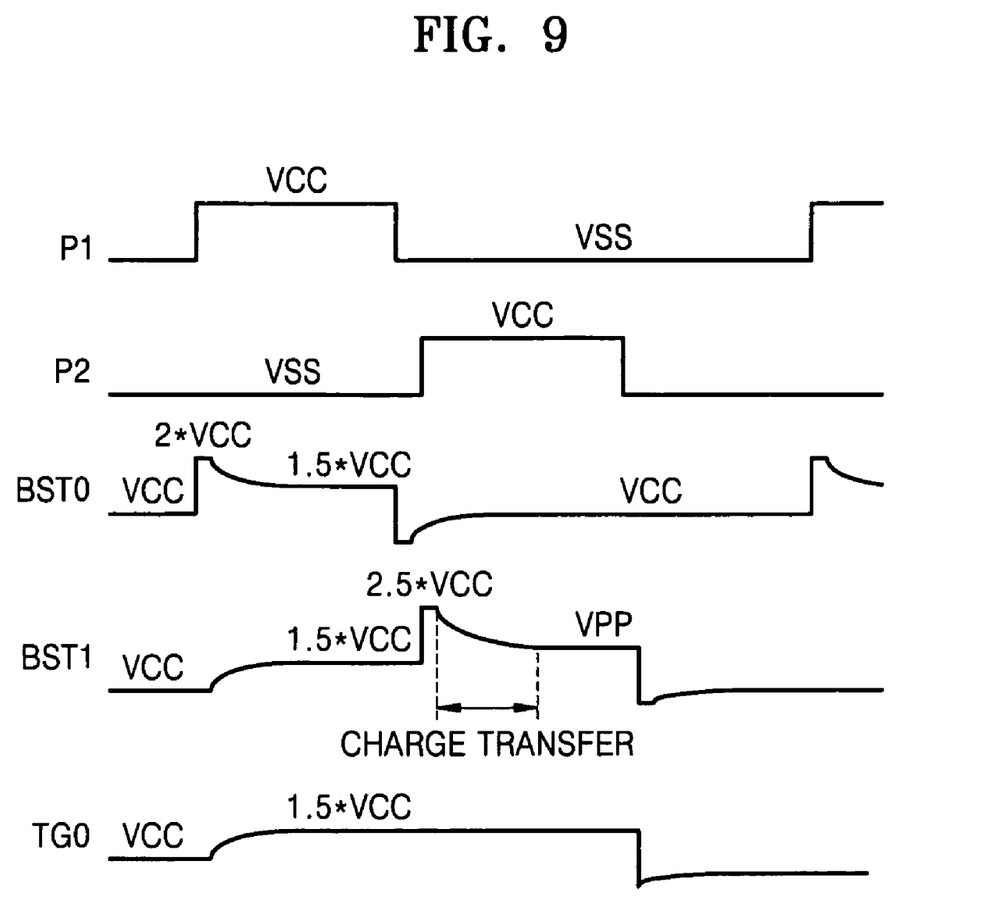
FIG. 9 is a timing diagram illustrating the power-up operation of the boost voltage generating circuit shown in FIG. 7.

FIG. 8 is a timing diagram illustrating the normal operation of the boost voltage generating circuit shown in FIG. 7. FIG. 9 is a timing diagram illustrating the power-up operation of the boost voltage generating circuit shown in FIG. 7. Referring to FIGS. 8 and 9, the operation of the boost voltage generating circuit according to an embodiment will now be described in detail.

In the conventional boost voltage generating circuit shown in FIG. 1, when the VPP level shifter 21 does not operate at a low power supply voltage VCC, the voltage of the gate TG0 of the transfer transistor NT1 is held at the power supply voltage VCC, as shown in FIG. 3. Accordingly, although the voltage of the boost node BST1 is boosted to 2.5*VCC by the control signals P1 and P2, insufficient charge is transferred through the transfer transistor NT1, and thus the voltage of the output node VPP does not increase above VCC-VT.

However, in the boost voltage generating circuit shown in FIG. 7, the additional pump circuit 75 boosts the voltage of the gate TG0 of the transfer transistor NT71 even though the VPP level shifter L71 does not operate at the low power supply voltage VCC. Accordingly, the voltage of the gate TG0 increases to 1.5*VCC, as shown in FIG. 9. As a result, the voltage of the output node VPP can increase to 1.5*VCC-VT. Here, VT denotes the threshold voltage of the NMOS transfer transistor NT71.

During normal operation, the voltage between the gate and the source Vgs of the transfer transistor NT1 is VCC in the conventional circuit shown in FIG. 1, but is 1.5*VCC in the embodiment shown in FIG. 7 when transferring charge. Accordingly, as shown in FIG. 8, the driving power of the transfer transistor NT71 increases when transferring charge, thus reducing the time required for transferring charge from the boost node BST1 to the output node VPP. Thereby, an active cycle time of the semiconductor memory device can be reduced.

Figure 10:
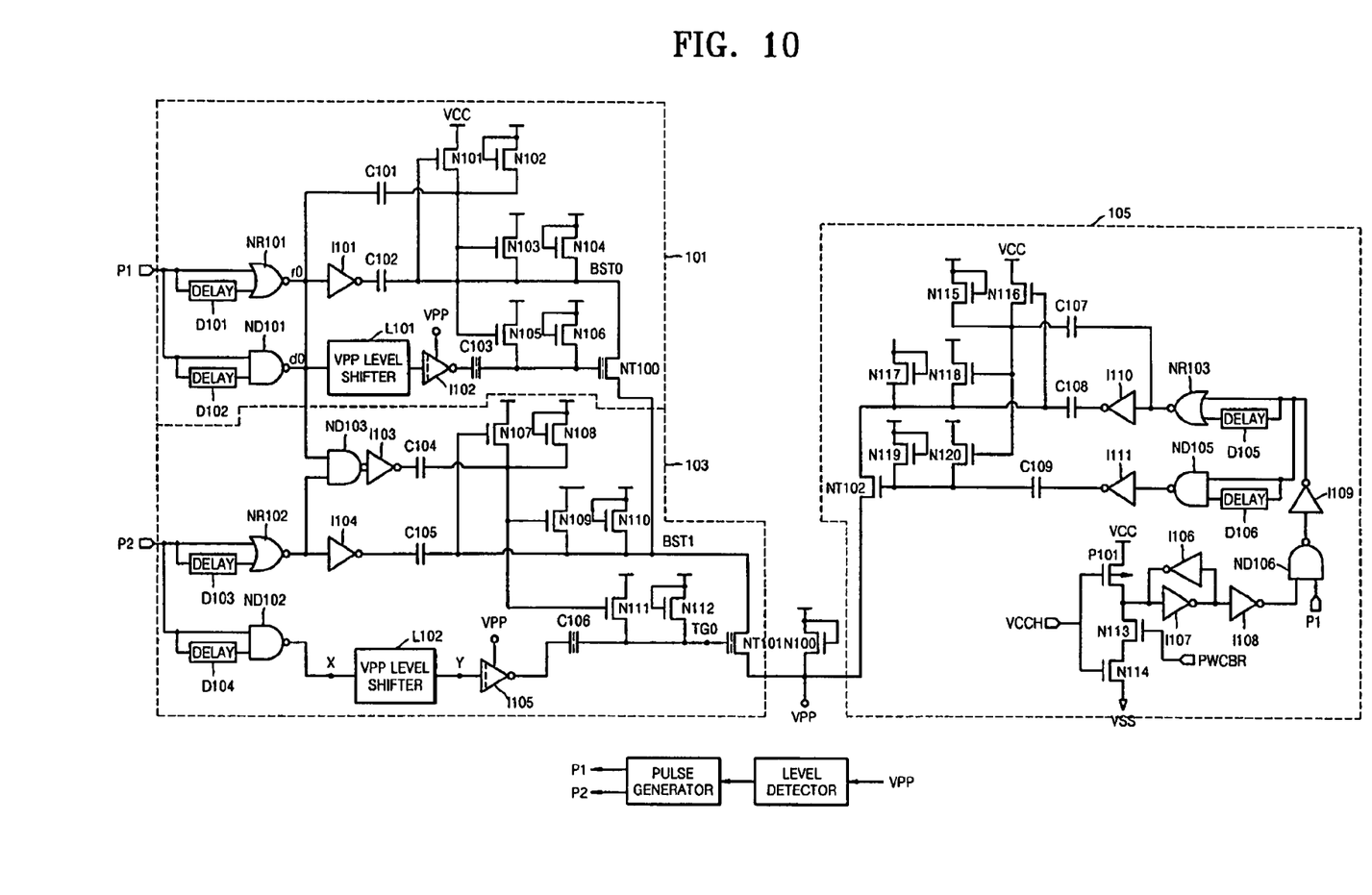
FIG. 10 is a circuit diagram illustrating a boost voltage generating circuit according to another embodiment.

FIG. 10 is a circuit diagram illustrating a boost voltage generating circuit according to another embodiment.

The boost voltage generating circuit according to another embodiment includes two unit pump circuits 101 and 103, an output control transistor N100 and an additional pump circuit 105.

This embodiment is different from the embodiment shown in FIG. 7 in that the additional pump circuit 105 is coupled to an output node VPP and additionally boosts the voltage of the output node VPP. The additional pump circuit 105 additionally boosts the voltage of the output node VPP in response to a control signal P1, a power-up reset signal VCCH generated during a power-up operation, and a pulse signal PWCBR generated when setting a mode register set (MRS) of the semiconductor memory device.

The additional pump circuit 105 and the unit pump circuits 101 and 103 have substantially the same structure as the additional pump circuit 75 and the unit pump circuits 71 and 73 shown in FIG. 7. The additional pump circuit 105 includes a NOR gate NR103, NAND gates ND105 and ND106, inverters I106 through I111, capacitors C107 through C109, a PMOS transistor P101, NMOS transistors N113 through N120, and an NMOS transfer transistor NT102.

The unit pump circuit 101 includes delay units D101 and D102, a NOR gate NR101, a NAND gate ND101, inverters I101 and I102, capacitors C101 through C103, a VPP level shifter L101, NMOS transistors N101 through N106, and an NMOS transfer transistor NT100. The unit pump circuit 103 includes delay units D103 and D104, a NOR gate NR102, NAND gates ND102 and ND103, inverters I103 through I105, capacitors C104 through C106, a VPP level shifter L102, NMOS transistors N107 through N112, and NMOS transfer transistor NT1O1.

The output control transistor N100 is equivalent to the output control transistor N70 shown in FIG. 7. The transistors NT 100, NT 101, the inverters I 102, I 105 and capacitors C103, C106 shown by dotted lines in FIG. 10 are the portions to which the VPP level is applied, and may use thick oxide in order to ensure reliability.

In the boost voltage generating circuit shown in FIG. 10, the voltage of the output node VPP is increased to 2*VCC by the additional pump circuit 105, even though the VPP level shifter L102 does not operate during the power-up operation. Thereafter, if the voltage of the output node VPP increases above the voltage for operating the VPP level shifter L102, the main pump circuits 101 and 103 may operate.

If the voltage of the output node VPP increases to above 2*VCC, the additional pump circuit 105 need not operate. Accordingly, in the embodiment of FIG. 10, if the power-up reset signal VCCH is set to "HIGH" and the pulse signal PWCBR generated when setting the MRS is set to "HIGH," the additional pump circuit 105 is disabled.

As mentioned above, according to the boost voltage generating circuit and method, a boost voltage VPP can increase above the setup voltage of the power-up reset pulse signal VCCHB even when the power supply voltage VCC is low, and thus the charge of the boost node BST1 can be rapidly transferred to the output node VPP.

While embodiments have been particularly shown and described with reference to the drawings, it will be understood by those of ordinary skill in the art that various changes in form and details may be made therein without departing from the spirit and scope of the invention as defined by the following claims.

What is claimed is:

1. A boost voltage generating circuit of a semiconductor device, comprising:
    a first pump circuit having a transfer transistor, the first pump circuit to boost a voltage of a boost node and to transfer charge from the boost node to an output node through the transfer transistor in response to at least one control signal;
    a second pump circuit to boost a voltage of the gate of the transfer transistor;
    an additional pump circuit to increase the voltage of the gate of the transfer transistor; and
    a boost voltage detector to generate the at least one control signal in response to a voltage of the output node;
    wherein the gate of the transfer transistor is not connected to the boost node or the output node.

2. The boost voltage generating circuit according to claim 1, wherein the additional pump circuit is responsive to the at least one control signal.

3. The boost voltage generating circuit according to claim 1, wherein the first pump circuit comprises a plurality of unit pump circuits.

4. The boost voltage generating circuit according to claim 1, wherein the additional pump circuit increases the voltage of the gate of the transfer transistor when a power supply voltage is below a threshold voltage of a level shift transistor that drives the second pump circuit.

5. The boost voltage generating circuit according to claim 1, wherein the additional pump circuit operates during a power-up operation of the semiconductor device.

6. The boost voltage generating circuit according to claim 1, wherein the boosted voltage of the gate of the transfer transistor is greater than a power supply voltage during a power-up operation.

7. A boost voltage generating circuit of a semiconductor device, comprising:
    a main pump circuit having a first transfer transistor, the main pump circuit to boost a voltage of a first boost node and to transfer charge from the first boost node to an output node through the first transfer transistor in response to a first control signal;
    an additional pump circuit having a second transfer transistor, a first pump unit, and a second pump unit; and
    a boost voltage detector to generate the first control signal in response to a voltage of the output node;
    the first pump unit to boost a voltage of a second boost node and to transfer charge from the second boost node to the output node through the second transfer transistor in response to a second control signal;
    the second pump unit to boost a voltage of a gate of the second transfer transistor in response to the second control signal;
    wherein the gate of the transfer transistor is not connected to the boost node or the output node.

8. The boost voltage generating circuit according to claim 7, wherein the additional pump circuit is responsive to the first control signal.

9. The boost voltage generating circuit according to claim 7, wherein the second control signal is a power-up reset signal.

10. The boost voltage generating circuit according to claim 7, wherein the second control signal is a pulse signal generated when setting a mode register set of the semiconductor device.

11. The boost voltage generating circuit according to claim 7, wherein the main pump circuit comprises a plurality of unit pump circuits.

12. A method for generating a boost voltage for a semiconductor device, comprising:
    boosting the voltage of a boost node in response to at least one control signal;
    transferring charge from the boost node to an output node through a transfer transistor;
    boosting the voltage of a gate of the transfer transistor;
    additionally increasing the voltage of the gate of the transfer transistor;
    detecting a voltage of the output node; and
    generating the at least one control signal in response to the detected result;
    wherein the gate of the transfer transistor is not connected to the boost node or the output node.

13. The method according to claim 12, wherein additionally increasing the voltage of the gate of the transfer transistor comprises additionally boosting the voltage in response to the at least one control signal.

14. The method according to claim 12, wherein boosting the voltage of the boost node comprises boosting the voltage of the boost node using a plurality of stages.

15. The method according to claim 12, wherein additionally boosting the voltage comprises additional boosting the voltage when a power supply voltage is below a threshold voltage of a level shifter transistor that drives the second pump circuit during a power-up operation.

16. A method for generating a boost voltage for a semiconductor device, comprising:
   boosting the voltage of a first boost node in response to a first control signal;
   transferring charge from the first boost node to an output node through a first transfer transistor;
   boosting the voltage of a second boost node in response to a second control signal;
   boosting the voltage of a gate of a second transfer transistor in response to the second control signal; and
   transferring charge from the second boost node to the output node through the second transfer transistor, thereby additionally boosting the voltage of the output node;
   wherein the gate of the transfer transistor is not connected to the boost node or the output node.

17. The boost voltage generating method according to claim 16, wherein transferring charge from the second boost node to the output node through the second transfer transistor is in response to the at least one control signal.

18. The boost voltage generating method according to claim 16, wherein the second control signal is a power-up reset signal.

19. The boost voltage generating method according to claim 16, wherein the second control signal is a pulse signal generated when setting a mode register set of the semiconductor device.

20. The boost voltage generating method according to claim 16, wherein boosting the voltage of the first boost node comprises boosting the voltage of the first boost node using a plurality of stages.

21. The boost voltage generating method according to claim 16, comprising:
   detecting a voltage of the output node; and
   generating the first control signal in response to the detected result.

* * * * *

UNITED STATES PATENT AND TRADEMARK OFFICE
CERTIFICATE OF CORRECTION

| | |
|---|---|
| PATENT NO. | : 7,576,589 B2 |
| APPLICATION NO. | : 11/360106 |
| DATED | : August 18, 2009 |
| INVENTOR(S) | : Ki-Chul Chun et al. |

It is certified that error appears in the above-identified patent and that said Letters Patent is hereby corrected as shown below:

Column 5, line 16, the word "NT1O1" should read -- NT101 --.

Signed and Sealed this

Twenty-fourth Day of November, 2009

David J. Kappos
*Director of the United States Patent and Trademark Office*